(12) United States Patent
Klee et al.

(10) Patent No.: US 6,444,920 B1
(45) Date of Patent: Sep. 3, 2002

(54) THIN FILM CIRCUIT WITH COMPONENT

(75) Inventors: Mareike K. Klee, Hückelhoven; Hans-Wolfgang Brand; Uwe Mackens, both of Aachen; Rainer Kiewitt, Roetgen, all of (DE); Antonius J. M. Nellisen; Antal F. J. Baggerman, both of Eindhoven (NL); Martin Fleuster, Aachen (DE); Marc De Samber, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/491,628

(22) Filed: Jan. 26, 2000

(30) Foreign Application Priority Data

Jan. 29, 1999 (DE) .......................................... 199 03 500

(51) Int. Cl.⁷ ................................................. H05K 1/16
(52) U.S. Cl. ..................... 174/260; 361/313; 439/85; 257/528
(58) Field of Search ................................. 174/260, 263; 361/302, 306.1, 308.1, 313; 257/528, 532; 439/55, 85

(56) References Cited

U.S. PATENT DOCUMENTS

| | | | | |
|---|---|---|---|---|
| 4,453,199 A | * | 6/1984 | Ritchie et al. | 361/306 |
| 5,053,916 A | * | 10/1991 | Weekamp et al. | 361/308 |
| 5,258,738 A | * | 11/1993 | Schat | 338/332 |
| 6,236,102 B1 | * | 5/2001 | Kim et al. | 257/532 |

* cited by examiner

Primary Examiner—Khiem Nguyen
(74) Attorney, Agent, or Firm—Ernestine C. Bartlett

(57) ABSTRACT

The invention relates to a thin film circuit with component. The thin film circuit comprises a network of capacitors, or a network of capacitors and resistors, or a network of capacitors, resistors and inductances, or a network of capacitors and inductances. Current supply contacts such as, for example, SMD end contacts or bump end contacts render it possible for the thin film circuit to be connected to further components of a circuit or, for example, to be combined with active components through the use of contact surfaces.

15 Claims, 1 Drawing Sheet

THIN FILM CIRCUIT WITH COMPONENT

BACKGROUND OF THE INVENTION

The invention relates to a thin film circuit comprising a component with at least
- first and a second current supply contact, and with
- a carrier substrate,
- at least a first structured electrically conducting layer,
- superimposed thereon al least one structured dielectric, and
- superimposed thereon at least a second structured electrically conducting layer, as well as to such a component.

The development of many electronic appliances is characterized by the following trends: miniaturization, higher reliability, lower or at least constant price levels accompanied by a higher functional level. In spite of all efforts at digitization, the number of passive components is found to account for 70% of the total number of components present in many consumer electronics appliances, for example in TV sets and video recorders.

A step in the direction towards a steady miniaturization is the so-called SMD technology. This technology is based on miniaturized components (SMDs, Surface Mounted Devices) which are mounted directly on the surface of printed circuit boards or ceramic substrates. SMDs are substantially smaller than corresponding traditionally wired components. If used consistently, they may reduce the surface or space requirement and the weight of the components to one half or even one third. It is also possible to achieve a cost reduction through an optimized use of the SMD technology because smaller circuit boards can be used.

However, the continuing miniaturization also renders the manufacture, handling, and mounting of the passive SMD components ever more difficult. This can be counteracted in that integrated passive components (IPCs) are used. In this technology, passive components such as, for example, resistors (R), capacitors (C) or inductances (L) are combined into inseparable basic circuits and systems. The use of thin film techniques with masks creates so-called thin film circuits or networks on carrier plates of an insulating material, forming printed circuits which are very strongly reduced in size. The manufacture of thin film circuits is known and is usually carried out by means of several consecutive or simultaneous layer-forming processes. Various layers of different shapes, compositions, and thicknesses are to be provided in order to create a thin film circuit which comprises a combination of resistors, capacitors, or inductances.

A simple realization of circuits with widely differing passive and active components is achieved through a combination of discrete (SMD) components with active components having a special function (for example, a filtering function). A disadvantage here is, however, that SMD elements all have to be soldered individually. Large surface areas are required for the solder spots, so that the circuits become very bulky.

SUMMARY OF THE INVENTION

The invention has for its object to reduce the sizes of electrical circuits made up of passive components or of passive and active components further.

This object is achieved by means of a thin film network comprising a component with at least a first and a second current supply contact, and with
- a carrier substrate,
- super imposed thereon at least a first structured electrically conducting layer,
- superimposed thereon at least one structured dielectric, and
- superimposed thereon at least a second structured electrically conducting layer,
- which is characterized in that the current supply contact is an electroplated end contact or a bump end contact or a contact surface.

Each and every component according to the invention can be electrically connected to further components of a circuit by its current supply contacts, which are usually provided at mutually opposed sides of the component. Depending on the nature of the application or the nature of the component mounting, an electroplated SMD end contact or a bump end contact or a contact surface may be used. The use of SMD end contacts made from, for example, Cr/Cu, Ni/Sn or Cr/Cu, Cu/Ni/Sn or Cr/Ni, Pb/Sn, or of bump end contacts renders it possible to manufacture discrete components. These are then merely to be fastened on the circuit board provided with conductor tracks. The use of contact surfaces renders possible the integration of the component with active elements.

In a preferred embodiment, a structured barrier layer is provided between the structured dielectric and the second structured electrically conducting layer.

The component according to the invention, after the individual layers have been structured, will comprise at least a capacitor with two electrically conducting layers (electrodes) and one dielectric. To prevent reactions between the structured dielectric and the second structured electrically conducting layer, a structured barrier layer may be included between the structured dielectric and the second structured electrically conducting layer.

In an advantageous embodiment, a third structured electrically conducting layer made of Cu, Au, Al, Cu-doped Al, Si-doped Al, or Mg-doped Al is provided over the second structured electrically conducting layer. After the materials have been deposited, the third electrically conducting layer is structured, for example by means of lithographic processes in combination with dry or wet etching methods, such that it acts as a thin film coil.

In this embodiment of the component according to the invention, the component will comprise with at least a capacitor and at least an inductance after structuring of the relevant layers.

In a further advantageous embodiment, a structured resistance layer is provided between the structured dielectric and the second structured electrically conducting layer.

A further advantageous embodiment may be formed in that a structured resistance layer is provided between the carrier substrate and the first structured electrically conducting layer.

The component will comprise at least a capacitor and at least a resistor in both embodiments of the component according to the invention after the relevant structuring operations on the individual layers.

In a preferred embodiment of this component according to the invention, a third structured electrically conducting layer made of Cu, Au, Al, Cu-doped Al, Si-doped Al, or Mg-doped Al is provided over the second structured electrically conducting layer.

This embodiment of the component will comprise at least a capacitor, at least a resistor, and at least an inductance after structuring of the relevant layers.

It may be preferred in components according to the invention comprising at least an inductance that a nucleating layer of Ti, Cr, $Ti_xW_y(0\leq x\leq 1, 0\leq y\leq 1)$, $Ti_xW_y$ $(0\leq x\leq 1, 0\leq y\leq 1)$/Au, Cr/Cu, $N_xCr_y(0\leq x\leq 1, 0\leq y\leq 1)$/Au or $Ti_xW_y$ $(0\leq x\leq 1, 0\leq y\leq 1)$/Cr/Cu is provided between the second structured electrically conducting layer and the third structured electrically conducting layer.

It is preferred for all components according to the invention that a ceramic material, a glass-ceramic material, a glass, or a ceramic material with a glass planarization layer is used as the carrier substrate. A carrier substrate made from these materials can be inexpensively manufactured, so that the processing cost for these components can be kept low.

It is furthermore preferred that the first and second structured electrically conducting layers are made from a material comprising a metal, or an alloy, or a conductive oxide, or a metal and an alloy, or a metal and a conductive oxide, or a metal and an alloy and a conductive oxide. After the materials have been deposited, the first and the second electrically conducting layer are structured, for example by means of photolithograpic processes with wet or dry etching steps, subject to the function which the thin film circuit has to fulfil.

It is also preferred that the dielectric comprises a material with a comparatively high relative dielectric constant $\in_r > 3$. Such materials enable high capacitance values in combination with small dimensions.

It may be preferred that an adhesion layer of Ti, Cr or $Ni_xCr_y(0\leq x\leq 1, 0\leq y\leq 1)$ is provided between the carrier substrate and the first structured electrically conducting layer. This adhesion layer improves the adhesion between the carrier substrate and the first electrically conducting layer.

It may also be preferred that a structured barrier layer is provided between the first structured electrically conducting layer and the structured dielectric.

This barrier layer prevents reactions between the first structured electrically conducting layer and the structured dielectric.

It is also preferred that a protective layer of an inorganic material and/or an organic material is provided over the entire thin film circuit.

The protective layer protects the subjacent layers from mechanical loads and from corrosion caused by moisture.

It may be also preferred that an anti-reaction layer is provided on the carrier substrate. Reactions with the dielectric as well as rough surfaces of the electrically conducting layers, which may lead to short-circuits of the capacitors or to bad high-frequency characteristics, can be avoided with such an anti-reaction layer.

The invention also relates to a component for a thin film circuit with at least a first and a second current supply contact, and with
- a carrier substrate,
- super imposed thereon at least a first structured electrically conducting layer,
- superimposed thereon at least one structured dielectric, and
- superimposed thereon at least a second structured electrically conducting layer,
- characterized in that the current supply contact is an electroplated SMD end contact or a bump end contact or a contact surface.

DETAILED DESCRIPTION OF THE INVENTION

Figure 1:
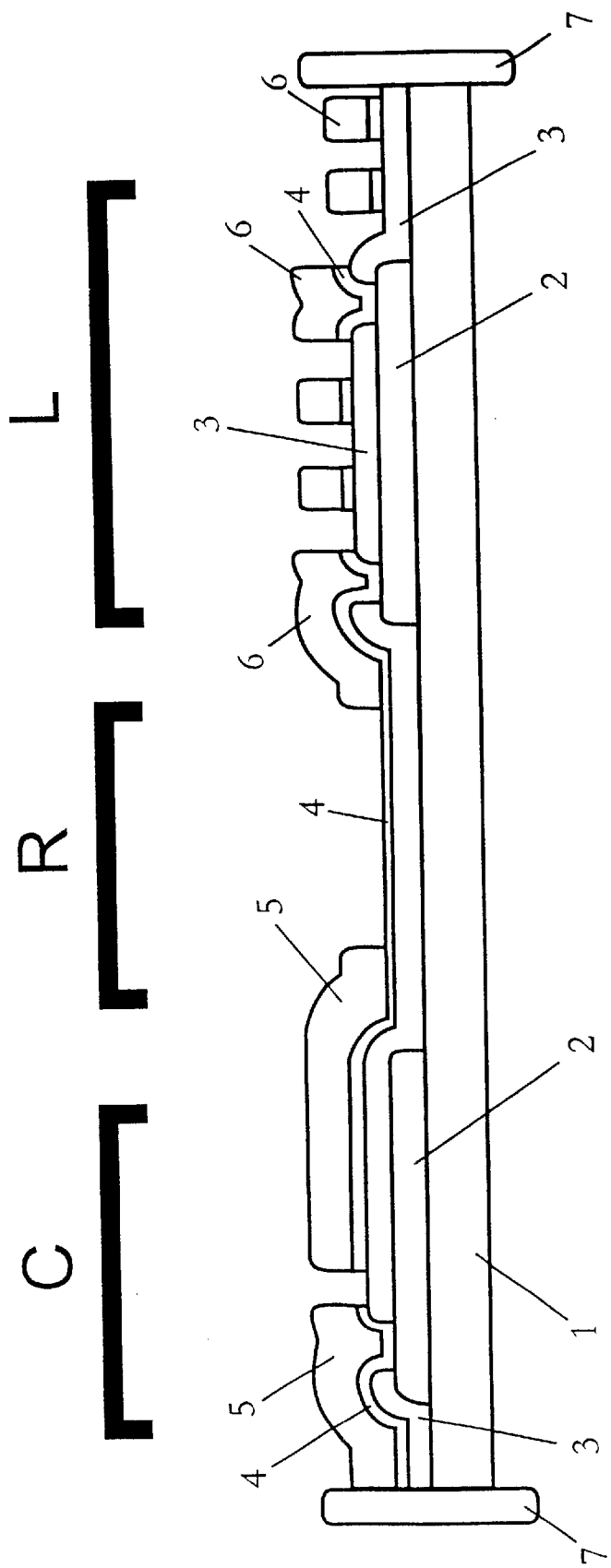
FIG. 1 shows in a cross-sectional diagrammatical view the construction of a thin film circuit with component according to the invention, here comprising a capacitor, a resistor, and an inductance.

The invention will now be described in greater detail with reference to the figure of the drawing and the embodiments that follow;

In FIG. 1, a thin film circuit with component comprises a carrier substrate 1, which comprises, for example, a ceramic material, a glass-ceramic material, a glass material, or a ceramic material with a glass planarization layer. A first electrically conducting layer 2 forming the lower electrode for the capacitors, the first conductive layer for the connection lines, and the connections for the inductances is provided on this carrier substrate and structured. In the next step, a dielectric 3 of a material having a relative dielectric constant $\in_r > 3$ is deposited. This layer will generally cover the entire surface area of the carrier substrate 1 and is interrupted in certain locations only so as to form contact holes to the subjacent first structured electrically conducting layer 2. The dielectric 3 may comprise, for example, $Si_3N_4$, $SiO_2$, $Si_xN_yO_z(0\leq x\leq 1, 0\leq y\leq 1, 0\leq z\leq 1)$, $Al_2O_3$, $Ta_2O_5$, $(Ta_2O_5)_x$—$(Al_2O_3)_{1-x}(0\leq x\leq 1)$, $(Ta_2O_5)_x$—$(TiO_2)_{1-x}$ $(0\leq x\leq 1)$, $(Ta_2O_5)_x$—$(Nb_2O_5)_{1-x}(0\leq x\leq 1)$, $(Ta_2O_5)_x$—$(SiO_2)_{1-x}(0\leq x\leq 1)$, $TiO_2$, $PbZr_xTi_{1-x}O_3(0\leq x\leq 1)$ with or without excess lead, $Pb_{1-\alpha y}La_yZr_xTi_{1-x}O_3(0\leq x\leq 1, 0\leq y\leq 0.2, 1.3\leq\alpha\leq 1.5)$, $Pb_{1-\alpha x}La_xTiO_3(0\leq x\leq 0.3, 1.3\leq\alpha\leq 1.5)$, $(Pb,Ca)TiO_3$, $BaTiO_3$, $BaTiO_3$ doped with Ce, $BaTiO_3$ doped with Nb and/or Co, $BaZr_xTi_{1-x}O_3(0\leq x\leq 1)$, $Ba_{1-x}Pb_xO_3(0\leq x\leq 1)$, $Ba_{1-y}Sr_yZr_xTi_{1-x}O_3(0\leq x\leq 1, 0\leq y\leq 1)$, $Ba_{1-x}Sr_xTiO_3(0\leq x\leq 1)$, $SrTiO_3$ doped with, for example, La, Nb, Fe or Mn, $SrZr_xTi_{1-x}O_3(0x=0$ to 1) with and without La-doping, $CaO_xZnO_y(Nb_2O_5)_z(x=0.01$ to 0.05, y=0.43 to 0.55, z=0.44 to 0.52), $(BaTiO_3)_{0.18\ to\ 0.27}$+$(Nd_2O_3)_{0.316\ to\ 0.355}$+$(TiO_2)_{0.276\ to\ 0.355}$+$(Bi_2O_3)_{0.025\ to\ 0.081}$+x ZnO, $CaTiO_3$+$CaTiSiO_5$, $(Sr,Ca)(Ti,Zr)O_3$, $(Sr,Ca,M)(Ti,Zr)O_3(M=Mg$ or Zn), $(Sr,Ca,Mg,Zn)(Ti,Zr,Si)O_3$, $(Sr,Ca,Cu,Mn,Pb)TiO_3$+$Bi_2O_3$, BaO—$TiO_2$—$Nd_2O_3$—$Nb_2O_5$, $(Bi_2O_3)_x(Nb_2O_5)_{1-x}$, and additions of $SiO_2$, $MnO_2$ or PbO, $BaTiO_3$ with $Nb_2O_5$, CoO, $CeO_2$, ZnO and manganese oxide as dopants, $BaTiO_3$+$CaZrO_3$, additions of $MnO_2$, MgO and rare earth oxides, $(Ba,Ca)TiO_3$+$Nb_2O_5$, $Co_2O_3$, $MnO_2$, $Zr(Ti,Sn)O_4$, BaO—PbO—$Nd_2O_3$—$TiO_2$, $Ba(Zn,Ta)O_3$, $BaZrO_3$, $Ba_2Ti_9O_{20}$, $Ba_2Ti_{9-x}Zr_xO_{20}$ $(0\leq x\leq 1)$ with and without Mn doping, $BaTi_5O_{11}$, $BaTi_4O_9$, $Ca_xSm_yTi_zO_n$, $(0\leq x\leq 1, 0.5\leq y\leq 1, 0\leq z\leq 1, 0\leq n\leq 1)$, $[Bi_3(Ni_2Nb)O_9]_{1-x}$—$(Bi_2(ZnNb_{2(1+d)y}O_{3+6y+5yd})_x(0\leq x\leq 1, 0.5\leq y\leq 1.5, -0.05\leq d\leq 0.05)$, $CaZrO_3$, $Nd_2Ti_2O_7$, $PbNb_{4/5x}((Zr_{0.6}Sn_{0.4})_{1-y}Ti_y))_{1-x}O_3(0\leq x\leq 0.9, 0\leq y\leq 1)$, $[Pb(Mg_{1/3}Nb_{2/3})O_3]_x$—$(PbTiO_3)_{1-x}(0\leq x\leq 1)$, $(Pb,Ba,Sr)(Mg_{1/3}Nb_{2/3})_xTi_y(Zn_{1/3}Nb_{2/3})_{1-x-y}O_3(0\leq x\leq 1, 0\leq y\leq 1, x+y\leq 1)$, i) $Pb(Mg_{0.5}W_{0.5})O_3$
ii) $Pb(Fe_{0.5}Nb_{0.5})O_3$
iii) $Pb(Fe_{2/3}W_{1/3})O_3$
iv) $Pb(Ni_{1/3}Nb_{2/3})O_3$
v) $Pb(Zn_{1/3}Nb_{2/3})O_3$
vi) $Pb(Sc_{0.5}Ta_{0.5})O_3$ as well as combinations of the compounds i) to vi) with $PbTiO_3$ and/or $Pb(Mg_{1/3}Nb_{2/3})O_3$ with and without excess lead. A resistance layer 4 is deposited on the dielectric layer 3 and structured. This structured resistance layer may comprise, for example, $Ni_xCr_y(0\leq x\leq 1, 0\leq y\leq 1)$, $Ni_xCr_yAl_z$, $(0\leq x\leq 1, 0\leq y\leq 1, 0\leq z\leq 1)$, $Ti_xW_yN_z(0\leq x\leq 1, 0\leq y\leq 1, 0\leq z\leq 1)$, $Ta_xN_y(0\leq x\leq 1, 0\leq y\leq 1)$, $Si_xCr_yO_z(0\leq x\leq 1, 0\leq y\leq 1, 0\leq z\leq 1)$, $Si_xCr_yN_z(0\leq x\leq 1, 0\leq y\leq 1, 0\leq z\leq 1)$, polysilicon, $Ti_xW_y(0\leq x\leq 1, 0\leq y\leq 1)$ or $Cu_xNi_y(0\leq x\leq 1, 0\leq y\leq 1)$. In the next step, a second electrically conducting layer 5 forming the upper electrodes of the capacitors is deposited and structured. The first electrically conducting layer 2 as well as the second electrically conducting layer 5 may comprise, for example, Pt(50 nm to 1 μm), Ti(10 to 20 nm)/Pt(20 to 600 nm), Ti(10 to 20 nm)/Pt(20 to 600 nm)/Ti(5 to 20 nm), Al, Al doped with a few percent of Cu, Al doped with a few per cents of Si, Al doped with a few percent of Mg, Ti/Pt/Al, Ti/Ag, Ti/Ag/Ti, W, Ni, Cu, Ti/Ag/Ir, Ti/Ir, Ti/Pd, Ti/Ag$_{1-x}$Pt$_x$(0≤x≤1), Ti/Ag$_{1-x}$Pd$_x$(0≤x≤1), Ti/Pt$_{1-x}$Al$_x$(0≤x≤1), Pt$_{1-x}$Al$_x$(0≤x≤1), Ti/Ag/Pt$_{1-x}$Al$_x$ (0≤x≤1), Ti/Ag/Ru, Ti/Ag/Ir/IrO$_x$(0≤x≤2), Ti/Ag/Ru/RuO$_x$(0≤x≤2), Ti/Ag/Ru/Ru$_x$Pt$_{1-x}$(0≤x≤1), Ti/Ag/Ru/Ru$_x$Pt$_{1-x}$/RuO$_y$(0≤x≤1, 0≤y≤2), Ti/Ag/Ru/RuO$_x$/Ru$_y$Pt$_{1-y}$(0≤x≤2, 0≤y≤1), Ti/Ag/Ru$_x$Pt$_{1-x}$(0≤x≤1), Ti/Ag/Pt$_x$Al$_{1-x}$(0≤x≤1), Pt$_x$Al$_{1-x}$/Ag/Pt$_y$Al$_{1-y}$(0≤x≤1, 0≤y≤1), Ti/Ag/Pt$_y$(RhO$_x$)$_{1-y}$(0≤x≤2, 0≤y≤1), Ti/Ag/Rh/RhO$_x$(0≤x≤2), Ti/Ag/Pt$_x$Rh$_{1-x}$(0≤x≤1), Ti/Ag/Pt$_y$(RhO$_x$)$_{1-y}$/Pt$_z$Rh$_{1-z}$(0≤x≤2, 0≤y≤1, 0≤z≤1), Ti/Ag$_x$Pt$_{1-x}$/Ir (0≤x≤1), Ti/Ag$_x$Pt$_{1-x}$Ir/IrO$_y$(0≤x≤1, 0≤y≤2), Ti/Ag$_x$Pt$_{1-x}$/Pt$_y$Al$_{1-y}$(0≤x≤1, 0≤y≤1), Ti/Ag$_x$Pt$_{1-x}$/Ru (0≤x≤1), Ti/Ag$_x$Pt$_{1-x}$/Ru/RuO$_y$(0≤x≤1, 0≤y≤2), Ti/Ag/Cr, Ti/Ag/Ti/ITO, Ti/Ag/Cr/ITO, Ti/Ag/ITO, Ti/Ni/ITO, Ti/Ni/Al/ITO, Ti/Ni or Ti/Cu. For forming the inductances, a third electrically conducting layer 6 comprising, for example, Cu, Au, Al, Cu-doped Al, Si-doped Al, or Mg-doped Al is deposited on the second electrically conducting layer 5 and structured. In addition, current supply contacts 7 are provided at mutually opposed sides of the component. An electroplated SMD end contact of Cr/Cu, Ni/Sn or Cr/Cu, Cu/Ni/Sn or Cr/Ni, Pb/Sn, or a bump end contact or a contact surface may be used as the current supply contact.

Furthermore, an anti-reaction layer made of glass, TiO$_2$, Al$_2$O$_3$ or ZrO$_2$ may be deposited on the carrier substrate 1.

Alternatively, an adhesion layer comprising, for example, Ti, Cr or Ni$_x$Cr$_y$(0≤x≤1, 0≤y≤1) may be provided between the carrier substrate 1 or the anti-reaction layer, if present, and the first electrically conducting layer 2.

Furthermore, a barrier layer comprising, for example, Ti, Cr, Ti$_x$W$_y$(0≤x≤1, 0≤y≤1), Ir$_x$O$_y$(0≤x≤1, 0≤y≤1), Ru$_x$O$_y$(0≤x≤1, 0≤y≤1), Ti$_x$Cr$_y$(0x≤1, 0≤y≤1), Pt$_x$Rh$_y$O$_z$ (0≤x≤1, 0≤y≤1, 0≤z≤1), Pt$_x$Al$_y$(0≤x≤1, 0≤y≤1), Ni$_x$Cr$_y$(0≤x≤1, 0≤y≤1) or ITO may be provided between the first electrically conducting layer 2 and the dielectric 3. Alternatively, a barrier layer may be provided between the dielectric 3 and the second electrically conducting layer 5 in the case of a thin film circuit which comprises only capacitors.

The resistance layer, which is made, for example, from Ni$_x$Cr$_y$(0≤x≤1, 0≤y≤1), Ni$_x$Cr$_y$Al$_z$(0≤x≤1, 0≤y≤1, 0≤z≤1), Ti$_x$W$_y$N$_z$(0≤x≤1, 0≤y≤1, 0≤z 1), Ta$_x$N$_y$ (0≤x≤1, 0≤y≤1), Si$_x$Cr$_y$O$_z$(0≤x≤1, 0≤y≤1, 0≤z≤1), Si$_x$Cr$_y$N$_z$(0≤x≤1, 0≤y≤1, 0≤z≤1), polysilicon, Ti$_x$W$_y$ (0≤x≤1, 0≤y≤1) or Cu$_x$Ni$_y$(0≤x≤1, 0≤y≤1) may alternatively be positioned between the carrier substrate 1 and the first structured electrically conducting layer 2.

Moreover, a nucleating layer of, for example, Ti, Cr, Ti$_x$W$_y$(0≤x≤1, 0≤y≤1), Ti$_x$W$_y$(0≤x≤1, 0≤y≤1)/Au,Cr/Cu, Ni$_x$Cr$_y$(0≤x≤1, 0≤y≤1)/Au or Ti$_x$W$_y$(0≤x≤1, 0≤y≤1)/Cr/Cu may be provided between the second structured electrically conducting layer 5 and the third structured electrically conducting layer 6.

A protective layer of an inorganic material such as, for example, SiO$_2$ or Si$_3$N$_4$ and/or an organic material such as, for example, polyimide or polybenzocyclobutene may be provided over the entire thin film circuit.

Embodiment 1

A first electrically conducting layer 2 of Al doped with Cu is deposited on a carrier substrate 1 of Al$_2$O$_3$ a with glass planarization layer and structured. In the next step, a dielectric 3 of Si$_3$N$_4$ is deposited over the entire surface of the carrier substrate 1 and structured. A structured resistance layer 4 of Ni$_{0.305}$Cr$_{0.57}$Al$_{0.125}$ is provided on the dielectric 3. A second electrically conducting layer 5 of Cu-doped Al is deposited over part of the resistance layer 4 and structured. A third electrically conducting layer 6 of Cu-doped Al is deposited over part of the second electrically conducting layer 5 and structured so as to form a thin film coil. The entire resultant thin film circuit is provided with a protective layer of Si$_3$N$_4$ and polyimide. In addition, Cr/Cu, Cu/Ni/Sn SMD end contacts are fastened to both sides of the component so as to form current supply contacts 7.

Embodiment 2

A first electrically conducting layer 2 of Al is deposited on a glass carrier substrate 1 and structured. In the next step, a dielectric 3 of Si$_3$N$_4$ is deposited over the entire surface of the carrier substrate 1 and structured. A structured resistance layer 4 of Ti$_{0.14}$W$_{0.51}$N$_{0.35}$ is present on the dielectric 3. A second electrically conducting layer 5 of Au is deposited on the resistance layer 4 and structured so as to form a thin film capacitor. A third electrically conducting layer 6 comprising Au is additionally deposited on a region of the second electrically conducting layer 5 and structured into a thin film coil. The resultant thin film circuit is provided with a protective layer of Si$_3$N$_4$ and polyimide. Furthermore, Cr/Cu, Cu/Ni/Sn SMD end contacts are provided on both sides of the component so as to form current supply contacts 7.

Embodiment 3

A TiO$_2$ planarizing layer is provided on a glass carrier substrate 1, and a first electrically conducting layer 2 of Ti/Pt is deposited thereon and structured. In the next step, a dielectric 3 of PbZr$_{0.53}$Ti$_{0.47}$O$_3$ doped with 5% lanthanum is deposited over the entire surface of the carrier substrate 1 and structured. On the dielectric 3 a structured resistance layer 4 of Ti$_{0.14}$W$_{0.51}$N$_{0.35}$ is provided. A second electrically conducting layer 5 of Al is deposited on the resistance layer 4 and structured. A third electrically conducting layer 6 comprising Cu-doped Al is deposited on a portion of the second electrically conducting layer 5 and structured into a thin film coil. The resultant thin film circuit is provided with a protective layer of Si$_3$N$_4$ and polyimide.

Furthermore, Cr/Cu, Cu/Ni/Sn SMD end contacts are provided on both sides of the component so as to form current supply contacts 7.

Embodiment 4

To manufacture a T-filter which comprises, for example, 16 resistors and 8 capacitors, a first electrically conducting layer 2 of Cu-doped Al is deposited on an Al$_2$O$_3$ carrier substrate 1 and structured. In the next step, a dielectric 3 of Si$_3$N$_4$ is deposited on the entire surface of the carrier substrate 1 and structured. A structured resistance layer 4 of Ni$_{0.305}$Cr$_{0.57}$Al$_{0.125}$ is provided on the dielectric 3. A second electrically conducting layer 5 of Cu-doped Al is provided on the resistance layer 4 and structured. The thin film circuit is provided with a protective layer of Si$_3$N$_4$ and polyimide. Furthermore, Cr/Cu, Cu/Ni/Sn SMD end contacts are provided on both sides of the component so as to form current supply contacts 7.

Embodiment 5

To realize a T-filter which comprises, for example, 16 resistors and capacitors, first an antireaction layer of TiO$_2$ and subsequently a first electrically conducting layer 2 of Ti/Pt are deposited on an $Al_2O_3$ carrier substrate 1 with glass planarization layer and structured. In the next step, a dielectric 3 of $PbZr_{0.53}Ti_{0.47}O_3$ doped with 5% lanthanum is deposited on the entire surface of the carrier substrate 1 and structured. A structured resistance layer 4 of $Ti_{0.14}W_{0.51}N_{0.35}$ is present on the dielectric. A second electrically conducting layer 5 of Al is provided on the resistance layer 4 and structured. The thin film circuit is provided with a protective layer of $Si_3N_4$ and polyimide. Furthermore, Cr/Cu, Ni/Sn SMD end contacts are provided on both sides of the component so as to form current supply contacts 7.

What is claimed is:

1. A thin film network comprising a component with at least a first and a second current supply contact (7) and with a carrier substrate (1), at least a first structured electrically conducting layer (2) superimposed upon, and contacting, said substrate, at least a first structured dielectric (3) superimposed upon, and contacting, said at least first structured electrically conducting layer (2), and at least a second structured electrically conductive layer (5) superimposed upon said at least first structured dielectric (3), characterized in that the current supply contact (7) is an electroplated SMD end contact, a bump end contact or a contact surface.

2. A thin film circuit with a component as claimed in claim 1, characterized in that a structured barrier layer is provided between the structured dielectric (3) and the second structured electrically conducting layer (5).

3. A thin film circuit with a component as claimed in claim 1, characterized in that a third structured electrically conducting layer (6) made of Cu, Au, Al, Cu-doped Al, Si-doped Al, or Mg-doped Al is provided over the second structured electrically conducting layer (5).

4. A thin film circuit with a component as claimed in claim 1, characterized in that a structured resistance layer (4) is provided between the structured dielectric (3) and the second structured electrically conducting layer (5).

5. A thin film circuit with a component as claimed in claim 1, characterized in that a structured resistance layer is provided between the carrier substrate (1) and the first structured electrically conducting layer (2).

6. A thin film circuit with a component as claimed in claim 4, characterized in that a third structured electrically conducting layer (6) made of Cu, Au, Al, Cu-doped Al, Si-doped Al, or Mg-doped Al is provided over the second structured electrically conducting layer (5).

7. A thin film circuit with a component as claimed in claim 3, characterized in that a nucleating layer of Ti, Cr, $Ti_xW_y$ ($0 \leq x \leq 1$, $0 \leq y \leq 1$), $Ti_xW_y$ ($0 \leq x \leq 1$, $0 \leq y \leq 1$)/Au, Cr/Cu, $Ni_xCr_y$ ($0 \leq x \leq 1$, $0 \leq y \leq 1$)/Au or $Ti_xW_y$ ($0 \leq x \leq 1$, $0 \leq y \leq 1$)/Cr/Cu is provided between the second structured electrically conducting layer (5) and the third structured electrically conducting layer (6).

8. A thin film circuit with a component as claimed in claim 1, characterized in that a ceramic material, a glass-ceramic material, a glass, or a ceramic material with a glass planarization layer is used as the carrier substrate (1).

9. A thin film circuit with a component as claimed in claim 1, characterized in that the structured electrically conducting layers (3, 5) are made from a material comprising a metal, or an alloy, or a conductive oxide, or a metal and an alloy, or a metal and a conductive oxide, or a metal and an alloy and a conductive oxide.

10. A thin film circuit with a component as claimed in claim 1, characterized in that the dielectric (3) comprises a material with a comparatively high relative dielectric constant $\epsilon_r > 3$.

11. A thin film circuit with a component as claimed in claim 1, characterized in that an adhesion layer of Ti, Cr or $Ni_xCr_y$ ($0 \leq x \leq 1$, $0 \leq y \leq 1$) is provided between the carrier substrate (1) and the first structured electrically conducting layer (2).

12. A thin film circuit with a component as claimed in claim 1, characterized in that a structured barrier layer is provided between the first structured electrically conducting layer (2) and the structured dielectric (3).

13. A thin film circuit with a component as claimed in claim 1, characterized in that a protective layer of an inorganic material and/or an organic material is provided over the entire thin film circuit.

14. A thin film circuit with a component as claimed in claim 1, characterized in that an antireaction layer is provided on the carrier substrate (1).

15. A component for a thin film circuit with at least a first and a second current supply contact (7) and with a carrier substrate (1), at least a first structured electrically conducting layer (2) superimposed upon, and contacting, said substrate, at least a first structured dielectric (3) superimposed upon, and contacting, said at least first structured dielectric (3), and at least a second structured electrically conducting layer (5) superimposed upon said at least first structured dielectric (3), characterized in that the current supply contact (7) is an electroplated SMD end contact, a bump end contact or a contact surface.

* * * * *